United States Patent
Luoh et al.

(10) Patent No.: US 10,497,652 B1
(45) Date of Patent: Dec. 3, 2019

(54) SEMICONDUCTOR SUBSTRATE AND SEMICONDUCTOR DEVICE

(71) Applicant: MACRONIX International Co., Ltd., Hsinchu (TW)

(72) Inventors: Tuung Luoh, Taipei (TW); Ling-Wuu Yang, Hsinchu (TW); Ta-Hung Yang, Miaoli County (TW); Kuang-Chao Chen, Taipei (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 16/051,122

(22) Filed: Jul. 31, 2018

(51) Int. Cl.
| | |
|---|---|
| *H01L 27/00* | (2006.01) |
| *H01L 29/00* | (2006.01) |
| *H01L 23/00* | (2006.01) |
| *H01L 27/02* | (2006.01) |
| *H01L 29/06* | (2006.01) |

(52) U.S. Cl.
CPC ........ *H01L 23/562* (2013.01); *H01L 27/0207* (2013.01); *H01L 29/0657* (2013.01)

(58) Field of Classification Search
CPC . H01L 23/562; H01L 23/50; H01L 23/49822; H01L 27/0207; H01L 27/088; H01L 27/1463; H01L 29/0657; H01L 29/1095; H01L 29/456
See application file for complete search history.

(56) References Cited

U.S. PATENT DOCUMENTS

| | | | | |
|---|---|---|---|---|
| 6,372,655 | B2* | 4/2002 | Khan | H01L 21/3065 216/59 |
| 8,017,472 | B2* | 9/2011 | Han | H01L 21/76232 257/E21.546 |
| 8,872,301 | B2* | 10/2014 | Hung | H01L 27/1463 257/432 |
| 9,748,187 | B2* | 8/2017 | Lee | H01L 24/06 |
| 2002/0016080 | A1* | 2/2002 | Khan | H01L 21/3065 438/714 |
| 2004/0248349 | A1 | 12/2004 | Renna et al. | |
| 2005/0042805 | A1 | 2/2005 | Swenson et al. | |

(Continued)

FOREIGN PATENT DOCUMENTS

| | | |
|---|---|---|
| JP | H07142571 | 6/1995 |
| JP | 2005228806 | 8/2005 |
| WO | 2005020648 | 3/2005 |

OTHER PUBLICATIONS

"Office Action of Taiwan Counterpart Application", dated Feb. 14, 2019, p. 1-p. 6.

(Continued)

*Primary Examiner* — Nikolay K Yushin
(74) *Attorney, Agent, or Firm* — J.C. Patents

(57) ABSTRACT

A semiconductor substrate and a semiconductor device are provided in which the substrate includes a plurality of chips. Each of the chips includes at least one array region and at least one periphery region. The semiconductor substrate has a plurality of trenches disposed in the array region and/or the periphery region, wherein a ratio of the depth of the trenches to the thickness of the semiconductor substrate is between 0.001 and 0.008, and the area of all the trenches is between 5% and 90% based on the total area of the semiconductor substrate.

17 Claims, 3 Drawing Sheets

(56) References Cited

U.S. PATENT DOCUMENTS

| | | | | |
|---|---|---|---|---|
| 2006/0035437 A1* | 2/2006 | Mitsuhira | ......... | H01L 21/76229 |
| | | | | 438/424 |
| 2007/0196996 A1* | 8/2007 | Han | ................. | H01L 21/76232 |
| | | | | 438/424 |
| 2013/0277790 A1* | 10/2013 | Hung | ................. | H01L 27/1463 |
| | | | | 257/461 |
| 2016/0181213 A1* | 6/2016 | Lee | ......................... | H01L 24/06 |
| | | | | 257/78 |
| 2017/0029664 A1* | 2/2017 | Park | ......................... | C09G 1/02 |

OTHER PUBLICATIONS

Office Action of Taiwan Counterpart Application, dated Nov. 19, 2018, pp. 1-4.

* cited by examiner

SEMICONDUCTOR SUBSTRATE AND SEMICONDUCTOR DEVICE

BACKGROUND

Technical Field

The invention relates to a semiconductor technology. More particularly, the invention relates to a semiconductor substrate and a semiconductor device with reduced bow height.

Description of Related Art

As wafer size increases and device size shrinks, lots of chips or dies can be simultaneously formed on a single wafer to reduce average cost.

However, if it is desired to form various devices and circuits on the wafer, the degree of stress concentration may be different in array regions and periphery regions due to different materials and different layouts during different processes, and thus high bow height may be occurred.

For example, if the bow height is too large (i.e. positive bow height is too high), the uniformity of film deposition may be affected, and the wafer may not be adsorbed resulting in relevant process failure. On the other hand, if the bow height is too low (i.e. negative bow height is too high), the critical dimension may be error, and the film may be undesirably deposited on the wafer back.

Therefore, it is necessary to find the solution for controlling the bow height of wafer during semiconductor process.

SUMMARY

The invention provides a semiconductor substrate which reduces bow height without change to original device layout design.

The invention provides a semiconductor device with above semiconductor substrate so as to keep low bow height during manufacture processes.

The semiconductor substrate of the invention includes chips. Each of the chips includes at least one array region and at least one periphery region. The semiconductor substrate has trenches disposed in the array region and/or the periphery region, wherein a ratio of the depth of the trenches to the thickness of the semiconductor substrate is between 0.001 and 0.008, and the area of all the trenches is between 5% and 90% based on the total area of the semiconductor substrate.

In an embodiment of the invention, the depth of the trenches is between 1 µm and 6 µm.

In an embodiment of the invention, the total area of the trenches is between 10% and 85% based on the total area of the semiconductor substrate.

In an embodiment of the invention, the trenches are disposed in the array region or the periphery region.

In an embodiment of the invention, the trenches are disposed in both the array region and the periphery region.

In an embodiment of the invention, the semiconductor substrate further includes a tensile stress layer formed on a bottom of the trenches.

In an embodiment of the invention, a material of the tensile stress layer comprises silicon nitride, tungsten, silicon carbide, silicon carbonitride, NiSi, CoSi, other dielectric material with tensile stress, or a combination thereof.

In an embodiment of the invention, a thickness of the tensile stress layer is equal to or less than the depth of the trenches.

In an embodiment of the invention, the thickness of the tensile stress layer is between 20 Å and 1.5 µm.

In an embodiment of the invention, the semiconductor substrate further includes a compressive stress layer formed on a bottom of the trenches.

In an embodiment of the invention, a material of the compressive stress layer comprises silicon oxynitride, silicon oxide, SiGe, or a combination thereof.

In an embodiment of the invention, a thickness of the compressive stress layer is equal to or less than the depth of the trenches.

In an embodiment of the invention, the thickness of the tensile compressive layer is between 20 Å and 1.5 µm.

In an embodiment of the invention, each of the trenches accounts more than 30% of the area of each of the chips.

In an embodiment of the invention, each of the trenches accounts more than 50% of the area of each of the chips.

The semiconductor device of the invention includes above semiconductor substrate.

In view of the foregoing, in the embodiments of the invention, there are large-area and deep trenches formed in the surface of the semiconductor substrate, and thus the bow height problem caused by differences in (deposited) materials and layout of the semiconductor device during processes can be released. In addition, if a stress material such as tensile stress material or compressive stress material is deposited in the trenches, the bow height of the semiconductor substrate may be further reduced.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
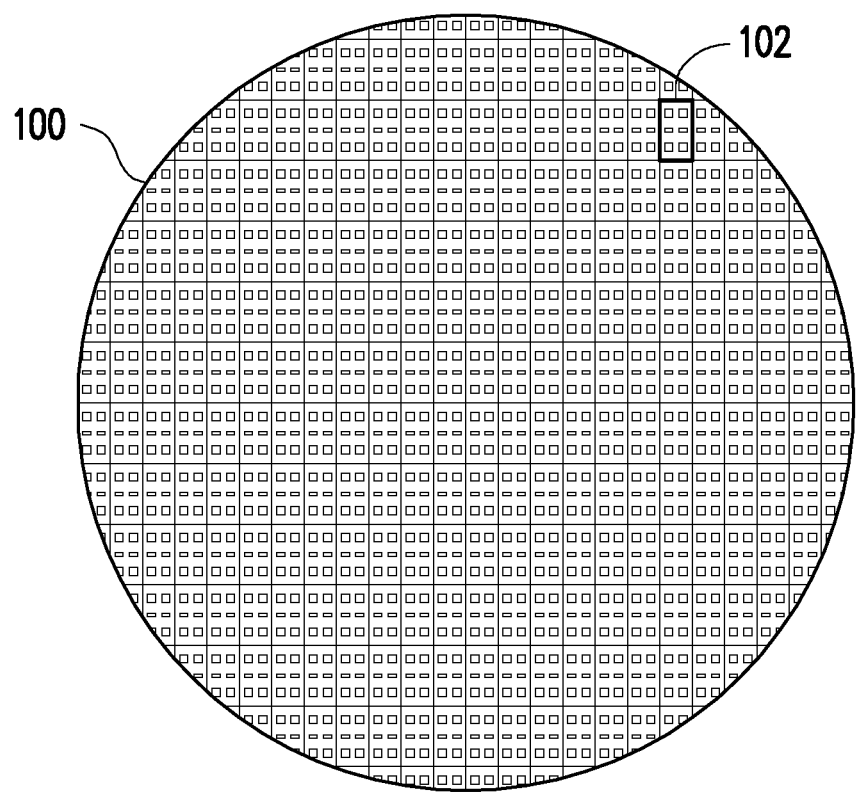
FIG. 1 is a schematic top view illustrating a semiconductor substrate according to a first embodiment of the invention.

The disclosure is described below in detail with reference to the accompanying drawings. However, the disclosure can also be implemented in a plurality of different forms, so it should not be interpreted as being limited in the following exemplary embodiments. In the accompanying drawings, for clarity, the size and relative size of each layer and each region may be not sized.

When a component or a layer is disposed "on" another component or layer herein, it may be directly on another component or layer, or there may be an intermediate component or layer therebetween if not otherwise specified. In addition, the spatial relative terms such as "above," "below," and the like are used to describe the relationship between one component and another (several) component(s) in the drawings. However, this spatial relative term may include directions of components in use or operation in addition to the state shown in the drawings. For example, if the components in the drawings are turned over, the components described as "below" another component or feature will then be oriented "above" another component or feature.

Figure 2:
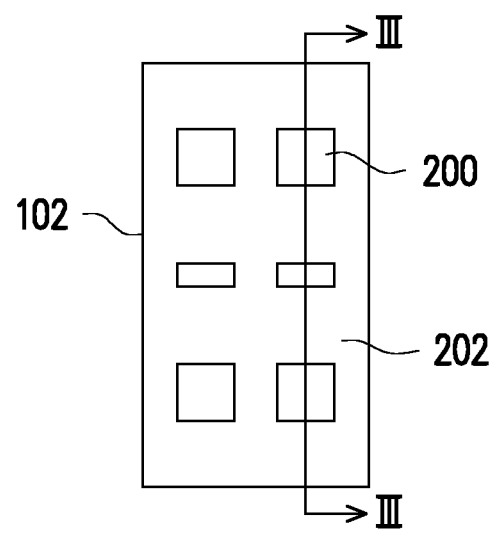
FIG. 2 is an enlarged view of portion of the semiconductor substrate of FIG. 1.

FIG. 1 is a schematic top view illustrating a semiconductor substrate according to a first embodiment of the invention. FIG. 2 is an enlarged view of portion of the semiconductor substrate of FIG. 1.

In FIG. 1, a semiconductor substrate 100 includes chips 102. FIG. 2 shows single chip 102 in FIG. 1, which includes array regions 200 and at least one periphery region 202. However, the invention is not limited therein. According to different layout design of device, the locations, shapes, numbers of the array region 200 and the periphery region 202 may be changed.

Figure 3:
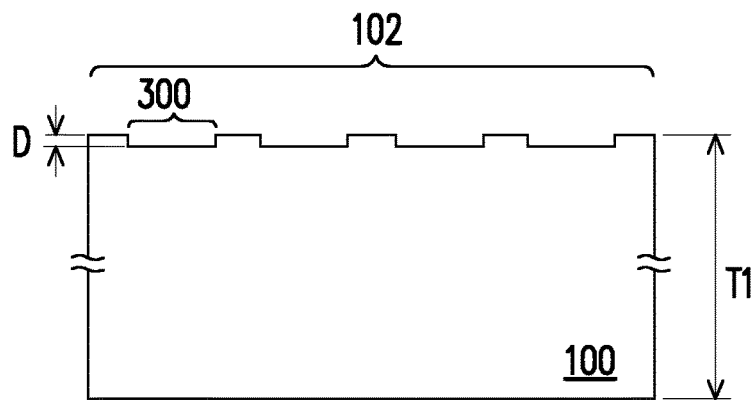
FIG. 3 is a schematic cross-sectional view of the semiconductor substrate of FIG. 1.

FIG. 3 is a cross-sectional view of the semiconductor substrate along III-III line in FIG. 1.

Referring to FIG. 3, the semiconductor substrate 100 has trenches 300 disposed in at least one of the array region and the periphery region. Although FIG. 3 merely shows the range of the chip 102, it should be known that the trenches 300 can be disposed in the array region, the periphery region, or both the array region and the periphery region. In the embodiment, a ratio of the depth D of the trenches 300 to the thickness T1 of the semiconductor substrate 100 is between 0.001 and 0.008. If the ratio (D/T1) is less than 0.001, it is not effective in reducing bow height; if the ratio (D/T1) is larger than 0.008, the bow height of the semiconductor substrate 100 may increase. For example, it the thickness T1 of the semiconductor substrate 100 is about 800 μm, the depth D of the trenches 300 is prefer 1-6 μm. In the embodiment, the area of all the trenches 300 is between 5% and 90% based on the total area of the semiconductor substrate 100. Based on the total area of the semiconductor substrate 100, if the area of all the trenches 300 is less than 5%, it is not effective in reducing bow height; if the area of all the trenches 300 is larger than 90%, the bow height problem may still occur as the thinning of the semiconductor substrate 100 in this case. In other embodiment, the area of all the trenches 300 is between 10% and 85% based on the total area of the semiconductor substrate 100. Moreover, each of the trenches 300 may account more than 30% of the area of each chip 102, preferably more than 50% of the area of each of the chips.

Figure 4:
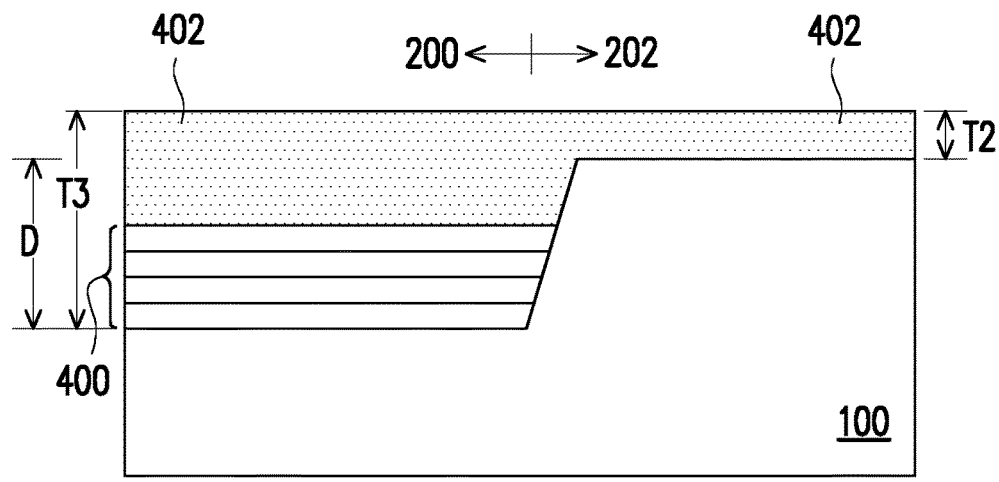
FIG. 4 is a schematic cross-sectional view illustrating a semiconductor device according to a second embodiment of the invention.

FIG. 4 is a schematic cross-sectional view illustrating a semiconductor device according to a second embodiment of the invention. It should be mentioned that the same reference numbers or symbols as those in the first embodiment are also used herein to represent the same components.

Referring to FIG. 4, since the array region 200 of the semiconductor substrate 100 in the second embodiment has a trench (e.g. 300 in FIG. 3), its surface is lower than that of the periphery region 202 by the depth D of the trench. Hence, after forming array films 400 (such as semiconductor elements, 3D devices, conductive films, etc.) in the array region 200 followed by depositing inter-layer dielectric (ILD) layer 402 and performing a planarization process (e.g. CMP), the total thickness T3 of the array films 400 and the ILD layer 402 in the array region 200 is thicker than the thickness T2 of the ILD layer 402 in the periphery region 202. Due to the presence of the foregoing deep trenches, the array films 400 can be formed in the deep trenches, and thus it is not necessary for the ILD layer 402 to be formed 2-8 μm thick in the periphery region 202 (in case of forming 3D devices). Accordingly, the stress caused by the thick (ILD) layer in the periphery region 202 can be greatly decreased, resulting in reducing the bow height of the substrate significantly.

Figure 5:
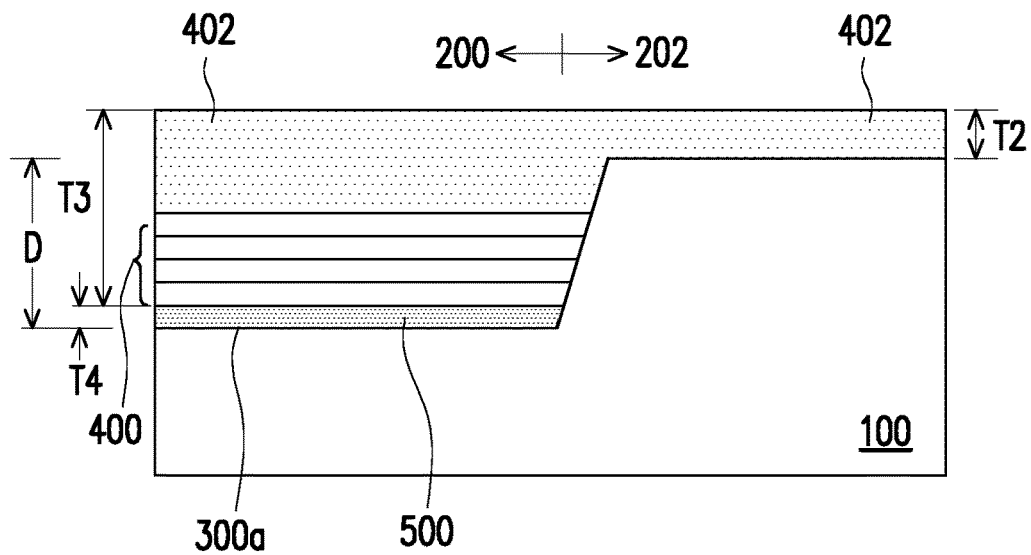
FIG. 5 is a schematic cross-sectional view illustrating another semiconductor device according to the second embodiment of the invention.

FIG. 5 is a schematic cross-sectional view illustrating another semiconductor device according to the second embodiment of the invention, wherein the same reference numbers or symbols as those in FIG. 4 are also used herein to represent the same components.

In FIG. 5, a stress layer 500 is formed on the bottom 300a of the trench. In one embodiment, the stress layer 500 is a tensile stress layer, and a material of the tensile stress layer, for instance, includes silicon nitride, tungsten, silicon carbide, silicon carbonitride, NiSi, CoSi, other dielectric layer with tensile stress, or a combination thereof. In other embodiment, the stress layer 500 is a compressive stress layer, and a material of the compressive stress layer, for instance, includes silicon oxynitride, silicon oxide, SiGe, or a combination thereof. In one embodiment, a thickness T4 of the stress layer 500 may be equal to or less than the depth D of the trench; in another embodiment, in the presence of the array films 400, the thickness T4 of the stress layer 500 may be equal to or less than the value of the depth D of the trench minus the thickness of the array films 400. For example, if the depth D of the trench is 1-6 μm, the thickness T4 of the stress layer 500 is between 20 Å and 1.5 μm, but the invention is not limited therein. The material of the stress layer 500 can be selected to have opposite stress to the ILD layer 402; for example, if the ILD layer 402 is a compressive stress layer (e.g. silicon oxide), the stress layer 500 can be a tensile stress layer (e.g. silicon nitride); vice versa. Accordingly, the bow height of the semiconductor substrate 100 may be further reduced by the stress layer 500 formed in the array region 200.

Experimental examples are listed below to prove the effect of the invention, but the invention is not limited thereto.

EXAMPLE 1

Figure 6:
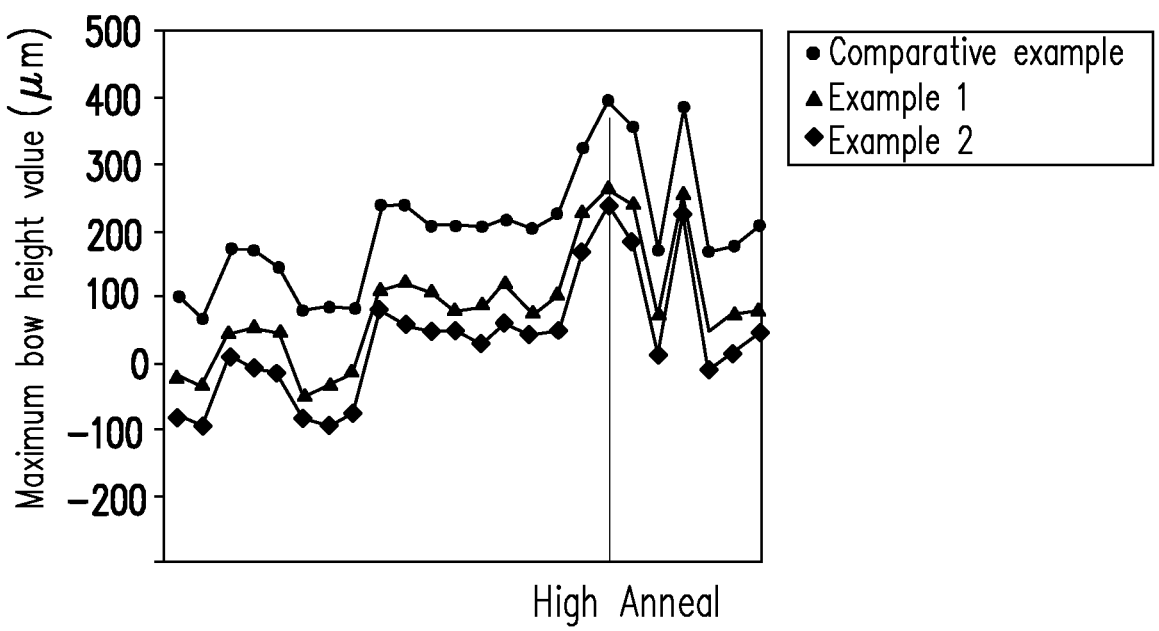
FIG. 6 is a graph showing the maximum bow height value of Examples 1-2 and Comparative example as the process progresses.

The semiconductor substrate 100 in FIG. 1 was utilized to perform semiconductor processes for forming the array films 400 and depositing the ILD layer 402 as shown in FIG. 4. The semiconductor processes orderly include patterning above large-area trenches, forming a conductive layer, patterning the conductive layer, isolation, STI formation at the periphery region, periphery MOS formation, forming the ILD layer, high (temperature) anneal, contact formation, and back-end-of-line (BEOL) process. The horizontal axis in FIG. 6 represents a process stage in which only the "High Anneal" is shown to distinguish the front-end-of-line (FEOL) process from the BEOL process. It can be seen from FIG. 6 that the effect of the invention is particularly evident in the FEOL process.

EXAMPLE 2

The semiconductor substrate 100 with the stress layer 500 in FIG. 5 was utilized to perform the same semiconductor processes as Example 1.

COMPARATIVE EXAMPLE

A planar EPI wafer without trench was utilized as a substrate to perform the same semiconductor processes as Example 1.

Analysis

Maximum bow height values of the semiconductor substrate in Examples 1-2 and Comparative example were recorded during each stage of the semiconductor processes, and then they were shown in FIG. 6.

According to FIG. 6, the maximum bow height of Comparative example is much more than that those of Examples 1-2. For example, the maximum bow height of Comparative example is 150 μm higher than that of Example 1. As for Example 2 having SiN stress layer, it is superior to Example 1 in reducing the bow height.

To sum up, the semiconductor substrate of the invention has large area ratio and deep trenches on a surface thereof, and thus the bow height of the semiconductor substrate can be released during processes. In addition, a tensile stress layer or a compressive stress layer can be deposited in the trenches to further reduce the bow height of the semiconductor substrate.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A semiconductor substrate comprising a plurality of chips, wherein
    each of the chips comprises at least one array region and at least one periphery region, and
    the semiconductor substrate has a plurality of trenches disposed in the array region or both the array region and the periphery region, wherein a ratio of a depth of the trenches to a thickness of the semiconductor substrate is between 0.001 and 0.008, each of the trenches accounts more than 30% of the area of each of the chips, and an area of the trenches is between 5% and 90% based on a total area of the semiconductor substrate;
    a plurality of array films formed in the trenches disposed in the array region; and
    at least one stress layer formed on the bottom of the trench, and the stress layer is disposed between the array films and the bottom of the trench.

2. The semiconductor substrate according to claim 1, wherein the depth of the trenches is between 1 μm and 6 μm.

3. The semiconductor substrate according to claim 1, wherein the total area of the trenches is between 10% and 85% based on the total area of the semiconductor substrate.

4. The semiconductor substrate according to claim 1, wherein each of the trenches accounts more than 50% of the area of each of the chips.

5. The semiconductor substrate according to claim 1, the stress layer is a tensile stress layer formed on a bottom of the trenches.

6. The semiconductor substrate according to claim 5, wherein a material of the tensile stress layer comprises silicon nitride, tungsten, silicon carbide, silicon carbonitride, NiSi, CoSi, or a combination thereof.

7. The semiconductor substrate according to claim 5, wherein a thickness of the tensile stress layer is equal to or less than the depth of the trenches.

8. The semiconductor substrate according to claim 7, wherein the thickness of the tensile stress layer is between 20 Å and 1.5 μm.

9. The semiconductor substrate according to claim 1, the stress layer is a compressive stress layer formed on a bottom of the trenches.

10. The semiconductor substrate according to claim 9, wherein a material of the compressive stress layer comprises silicon oxynitride, silicon oxide, SiGe, or a combination thereof.

11. The semiconductor substrate according to claim 9, wherein a thickness of the compressive stress layer is equal to or less than the depth of the trenches.

12. The semiconductor substrate according to claim 11, wherein the thickness of the tensile compressive layer is between 20 Å and 1.5 μm.

13. A semiconductor device, comprising the semiconductor substrate according to claim 1.

14. The semiconductor device according to claim 13, the stress layer is a compressive stress layer formed on a bottom of the trenches.

15. The semiconductor device according to claim 14, wherein a thickness of the compressive stress layer is between 20 Å and 1.5 μm.

16. The semiconductor device according to claim 13, the stress layer is a tensile stress layer formed on a bottom of the trenches.

17. The semiconductor device according to claim 16, wherein a thickness of the tensile stress layer is between 20 Å and 1.5 μm.

* * * * *